(12) United States Patent
Isshiki et al.

(10) Patent No.: US 10,135,243 B2
(45) Date of Patent: Nov. 20, 2018

(54) MANAGEMENT DEVICE AND POWER STORAGE SYSTEM

(71) Applicant: Panasonic Intellectual Property Management Co., Ltd., Osaka (JP)

(72) Inventors: Yasumasa Isshiki, Kanagawa (JP); Mutsuhiko Takeda, Kanagawa (JP); Noriharu Kobayashi, Aichi (JP); Jun Kikuchi, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 2 days.

(21) Appl. No.: 15/538,657

(22) PCT Filed: Jul. 27, 2016

(86) PCT No.: PCT/JP2016/003468
§ 371 (c)(1),
(2) Date: Jun. 22, 2017

(87) PCT Pub. No.: WO2017/033398
PCT Pub. Date: Mar. 2, 2017

(65) Prior Publication Data
US 2017/0366005 A1   Dec. 21, 2017

(30) Foreign Application Priority Data
Aug. 27, 2015   (JP) .................. 2015-168212

(51) Int. Cl.
*H02J 7/00* (2006.01)
*H02J 1/10* (2006.01)
(Continued)

(52) U.S. Cl.
CPC .......... *H02J 1/10* (2013.01); *G01R 19/16542* (2013.01); *G01R 31/02* (2013.01);
(Continued)

(58) Field of Classification Search
CPC ...................................... H02J 7/0016
(Continued)

(56) References Cited

U.S. PATENT DOCUMENTS

2008/0185994 A1* 8/2008 Altemose .............. H02J 7/0016
320/118
2013/0106354 A1* 5/2013 Suzuki ................. H02J 7/0016
320/116

FOREIGN PATENT DOCUMENTS

JP   2013-160539   8/2013

OTHER PUBLICATIONS

International Search Report of PCT application No. PCT/JP2016/003468 dated Aug. 23, 2016.

* cited by examiner

*Primary Examiner* — Edward Tso
*Assistant Examiner* — Ahmed Omar
(74) *Attorney, Agent, or Firm* — McDermott Will & Emery LLP

(57) ABSTRACT

In management device (10) for managing power storage device (20) in which a plurality of power storage blocks (B1 to B3) in which a plurality of series circuits of fuses and power storage cells is connected in parallel is connected in series, equalization controller 15 performs, when a voltage difference among the power storage blocks exceeds a set voltage difference, a control for equalizing power storage blocks (B1 to B3). Fuse blowout determination unit 18 determines, based on a frequency of equalization performed by equalization controller 15, whether one of the fuses is blown.

6 Claims, 6 Drawing Sheets

(51) Int. Cl.
  *G01R 31/36* (2006.01)
  *G01R 31/02* (2006.01)
  *H02J 7/02* (2016.01)
  *G01R 19/165* (2006.01)
  *H01M 10/48* (2006.01)

(52) U.S. Cl.
  CPC ......... *G01R 31/36* (2013.01); *G01R 31/3658* (2013.01); *H01M 10/482* (2013.01); *H02J 7/00* (2013.01); *H02J 7/0016* (2013.01); *H02J 7/0021* (2013.01); *H02J 7/0029* (2013.01); *H02J 7/0068* (2013.01); *H02J 7/02* (2013.01); *H02J 2007/0039* (2013.01)

(58) Field of Classification Search
  USPC ........................................................ 320/116
  See application file for complete search history.

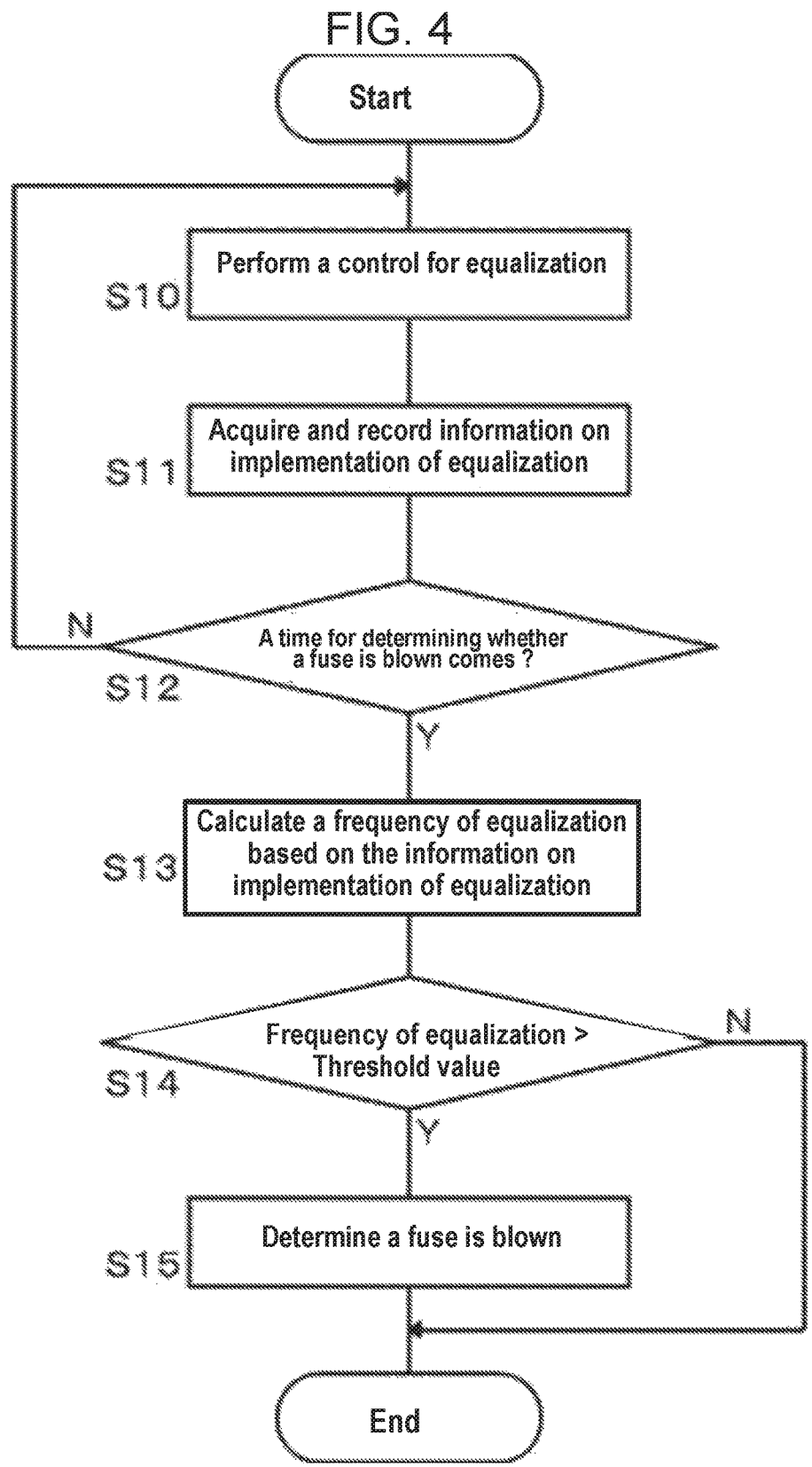

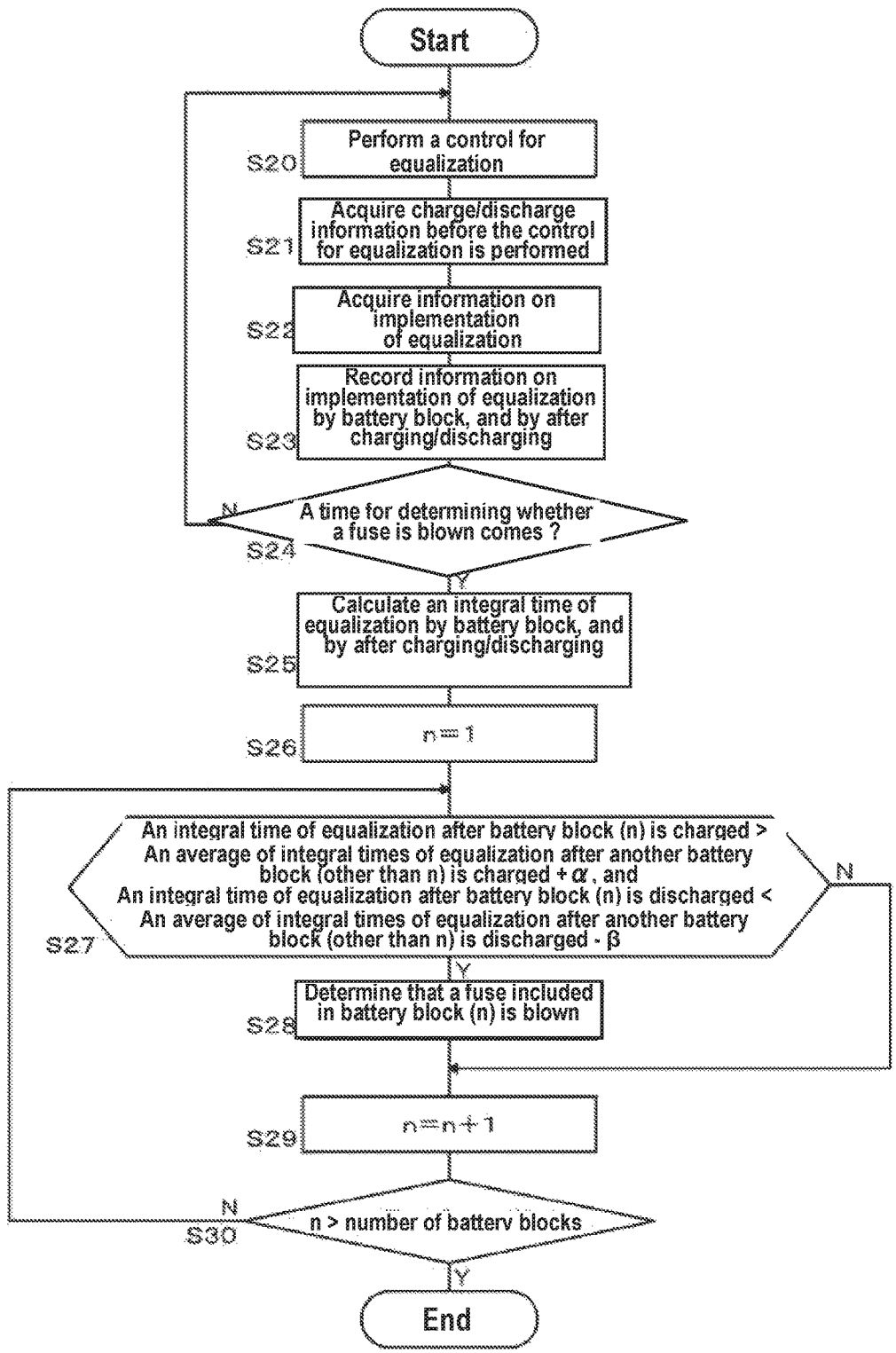

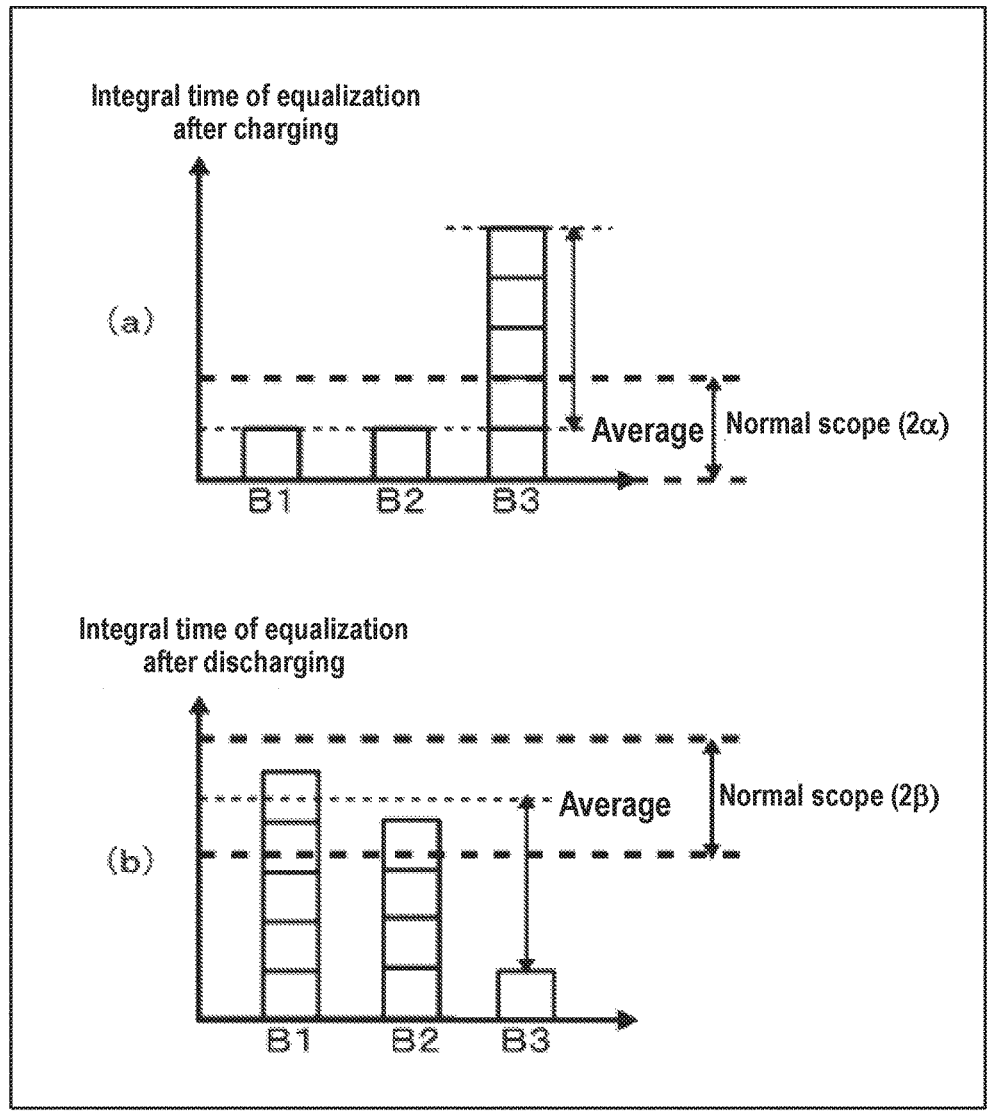

MANAGEMENT DEVICE AND POWER STORAGE SYSTEM

TECHNICAL FIELD

The present invention relates to a management device and a power storage system for performing a control for equalizing a plurality of power storage blocks configuring a power storage module.

BACKGROUND ART

In a battery module in which battery blocks in which a plurality of battery cells is connected in parallel are connected in series, a fuse that is connected in series to each of the battery cells and that is used for breaking an over current blows when an excessive current flows, and blocks a path. In each of the battery blocks, when many fuses blow, amounts of currents flowing into others of the battery cells in which no fuse is blown increase, and the increased amounts of currents burden the others of the battery cells. A system for detecting a blown fuse is therefore required.

For example, a possible idea is to detect a voltage at both ends of a fuse to detect whether the fuse is blown. However, when many battery cells are used, increases in a number of wires used, a circuit area, and a cost become significant. Another possible idea is to detect whether a fuse is blown based on a relationship between an amount of change in a State Of Charge (SOC) in a battery block and an assumed amount of change in an SOC when no fuse is blown (for example, see PTL 1). However, when obtaining an SOC through a current integration method, a method for detecting whether a fuse is blown based on an amount of change in SOC could be affected by an error when measuring a current.

CITATION LIST

Patent Literature

PTL 1: Unexamined Japanese Patent Publication No. 2013-160539

SUMMARY OF THE INVENTION

The present invention is developed for the purpose of solving such requirements. One non-limiting and explanatory embodiment provides a technology for precisely detecting at a lower cost whether a fuse connected to a cell is blown.

To solve the above-mentioned requirements, a management device according to an aspect of the present invention is a management device for managing a power storage device in which a plurality of power storage blocks in which a plurality of series circuits of fuses and power storage cells is connected in parallel is connected in series, and includes an equalization controller for performing, when a voltage difference among the power storage blocks exceeds a set voltage difference, a control for equalizing the power storage blocks, and a blowout determination unit for determining, based on a frequency of equalization performed by the equalization controller, whether one of the fuses is blown.

Any desired combinations of the above described components and converted expressions of the present invention in methods, devices, systems, and other similar entities are still effective as aspects of the present invention.

According to the present invention, whether a fuse connected to a cell is blown can precisely be detected at a lower cost.

BRIEF DESCRIPTION OF DRAWINGS

FIG. 4 is a flowchart illustrating an example of a process for determining whether a fuse is blown, according to a practical example 1.

FIG. 5 is a flowchart illustrating an example of a process for determining whether a fuse is blown, according to a practical example 2.

FIG. 6 is a view illustrating an example of integral times of equalization of the battery blocks after charging and integral times of equalization of the battery blocks after discharging.

DESCRIPTION OF EMBODIMENT

An exemplary embodiment of the present invention relates to a battery management device for managing a power storage module. Power storage modules that this exemplary embodiment encompasses are power storage modules in which a plurality of battery blocks in which a plurality of series circuits of fuses and battery cells is connected in parallel is connected in series. Available battery cells include lithium ion battery cells, nickel hydride battery cells, and lead battery cells. A voltage of a power storage module can be increased by connecting in series many battery cells, while a capacity of a power storage module can be increased by connecting in parallel many battery cells.

Figure 1:
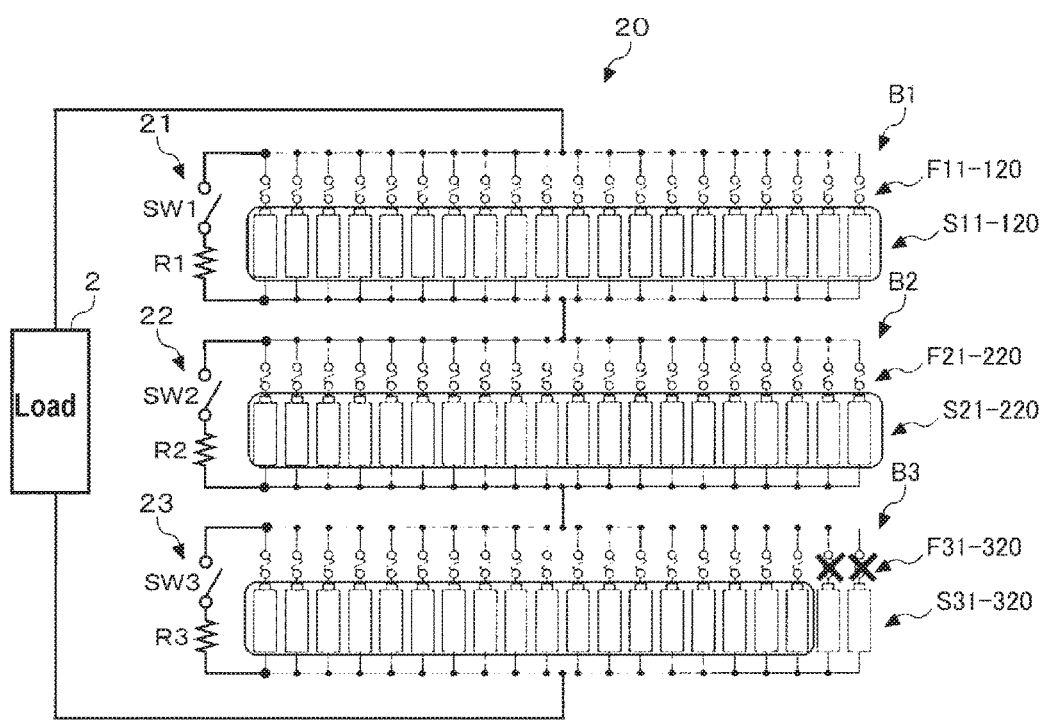
FIG. 1 is a view illustrating an example of a power storage module according to an exemplary embodiment of the present invention.

FIG. 1 is a view illustrating an example of power storage module 20 according to the exemplary embodiment of the present invention. In the example shown in FIG. 1, three battery blocks (first battery block B1, second battery block B2, and third battery block B3) are connected in series to form power storage module 20. In first battery block B1, positive electrodes of 20 battery cells S11 to S120 are respectively connected with fuses F11 to F120, and 20 battery cells S11 to S120 connected with the fuses are connected in parallel. The example shown in FIG. 1 renders cylindrical lithium ion batteries connected in parallel to form a battery block. Also in second battery block B2, similar to first battery block B1, positive electrodes of 20 battery cells S21 to S220 are respectively connected with fuses F21 to F220, and 20 battery cells S21 to S220 connected with the fuses are connected in parallel. Similarly, in third battery block B3, positive electrodes of 20 battery cells S31 to S320 are respectively connected with fuses F31 to F320, and 20 battery cells S31 to S320 connected with the fuses are connected in parallel.

First equalizing circuit 21 is connected in parallel to first battery block B1, second equalizing circuit 22 is connected in parallel to second battery block B2, and third equalizing circuit 23 is connected in parallel to third battery block B3. The example of FIG. 1 renders a series circuit of first discharge switch SW1 and first resistor R1 configuring first equalizing circuit 21. Second equalizing circuit 22 and third equalizing circuit 23 are configured in a similar manner. A configuration of this type is to equalize voltages of first battery block B1 to third battery block B3 through discharging. In first battery block B1 to third battery block B3, when one of the battery blocks has a least voltage, voltages of others of the battery blocks are leveled to the least voltage to achieve equalization. As an example, the discharge switches of the others of the battery blocks are controlled and turned on to cause the others of the battery blocks to discharge electricity so that the voltages of the others of the battery blocks lower to the least voltage of the one of the battery blocks.

Power storage module 20 is connected to load 2. For example, in an on-vehicle application, load 2 is a motor. In this case, between power storage module 20 and load 2, an inverter circuit (not shown) is connected. At a time of power running, DC power discharged from power storage module 20 is converted into AC power by the inverter circuit and supplied to the motor. At a time of regeneration, AC power generated by the motor is converted into DC power by the inverter circuit and used for charging power storage module 20. A chargeable configuration through a plug-in manner from an external battery charger may be applied.

When power storage module 20 is used for a stationary peak shaving/back up application, load 2 is a load of a system or a general/special purpose. Also in this case, between power storage module 20 and load 2, an inverter circuit (not shown) is connected. When charging power storage module 20, AC power supplied from the system is converted into DC power by the inverter circuit and used for charging power storage module 20. When discharging power storage module 20, DC power discharged from power storage module 20 is converted into AC power by the inverter circuit and allowed to flow back to the system, or supplied to a load of the general/special purpose. No inverter circuit is required when a charging power supply is a DC power supply such as a solar power generation system, and load 2 is a DC load. A DC/DC converter may be connected as required.

Figure 2:
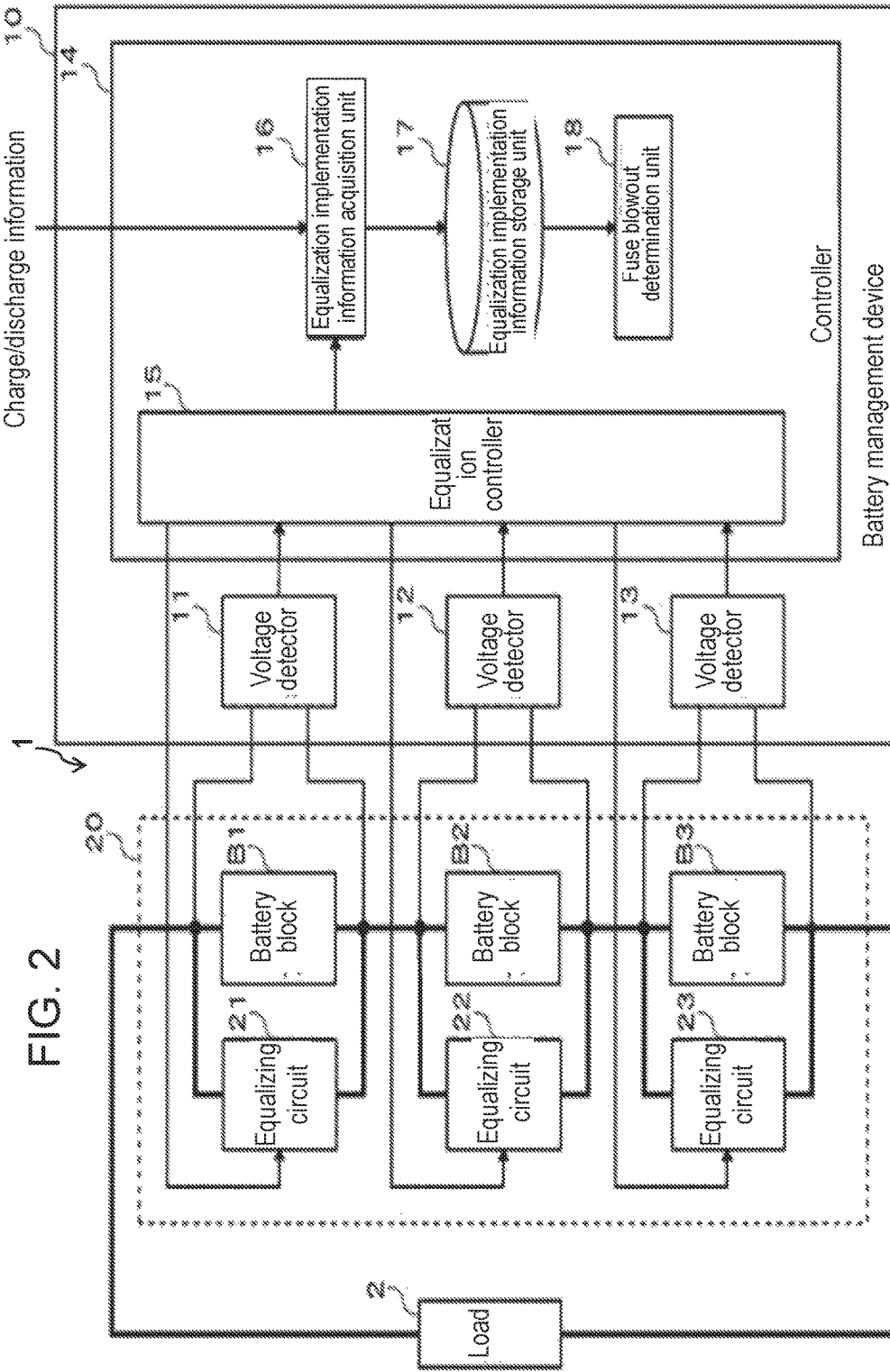
FIG. 2 is a view for describing a power storage system according to the exemplary embodiment of the present invention.

FIG. 2 is a view for describing power storage system 1 according to the exemplary embodiment of the present invention. Power storage system 1 includes power storage module 20 and battery management device 10. Hereinafter, an assumed example uses power storage module 20 shown in FIG. 1 as power storage module 20.

Battery management device 10 includes first voltage detector 11, second voltage detector 12, third voltage detector 13, and controller 14. First voltage detector 11 detects a voltage at both ends of first battery block B1, second voltage detector 12 detects a voltage at both ends of second battery block B2, and third voltage detector 13 detects a voltage at both ends of third battery block B3. Differential amplifier circuits using operational amplifiers may be used, for example, to configure first voltage detector 11 to third voltage detector 13.

Controller 14 includes equalization controller 15, equalization implementation information acquisition unit 16, equalization implementation information storage unit 17, and fuse blowout determination unit 18. A configuration of controller 14 can be achieved through a hardware resource and a software resource co-operating each other, or by a hardware resource only. Available hardware resources include microcomputers, DSPs, ROMs, RAMs, FPGAs, and other LSIs. Available software resources include programs such as firmware.

Equalization controller 15 performs, based on voltages of first battery block B1 to third battery block B3 entered from first voltage detector 11 to third voltage detector 13, when a voltage difference among the battery blocks exceeds a set voltage difference, a control for equalizing the battery blocks. In this exemplary embodiment, while power storage module 20 is neither charged nor discharged, a control for equalizing first battery block B1 to third battery block B3 is performed. In an on-vehicle application, a control for equalization is performed during an ignition off period. For example, when a difference in voltages (Open Circuit Voltage: OCV) among first battery block B1 to third battery block B3 exceeds 1% in terms of an SOC conversion, equalization controller 15 performs a control for equalization. For example, a control may be performed, so that, when a battery block has a least voltage, and a voltage difference between the least voltage and a voltage of another battery block is equal to or above a predetermined value set beforehand, a discharge switch of the other battery block is turned on to level or to almost level both the voltages. Another control may be performed, so that, when a battery block has a least voltage, a discharge switch of another battery block is turned on to level or to almost level a voltage of the other battery block to the least voltage.

Equalization implementation information acquisition unit 16 acquires information on implementation of equalization performed by equalization controller 15, and records the information in equalization implementation information storage unit 17. In this exemplary embodiment, information on implementation of equalization refers to information on discharging for equalizing battery blocks. Information on discharging includes a discharging time during which a discharge current flows. Equalization implementation information storage unit 17 is a non-volatile storage area for retaining information on implementation of equalization of battery blocks. Information on implementation of equalization exceeding a retention period is deleted. Fuse blowout determination unit 18 reads the information on implementation of equalization performed in a certain period, which is stored in equalization implementation information storage unit 17, calculates a frequency of equalization, and determines, based on the calculated frequency of equalization, whether a fuse is blown.

In this exemplary embodiment, a frequency of equalization is defined to a number of discharging for equalizing battery blocks performed in a certain period, or an accumulated time of discharging for equalizing battery blocks performed in a certain period. A single equalization control, for example, discharging of first battery block B1 and second battery block B2, increments a number of discharging of first battery block B1 and a number of discharging of second battery block B2. Each discharge time taken for this equalization is also added to each accumulated time of discharging. A specific example for determining whether a fuse is blown based on a frequency of equalization will be described later.

Even when none of fuses F11 to F320 is blown, voltages of first battery block B1 to third battery block B3 might become uneven. For example, power storage module 20 self-discharges when left behind, but an amount of self-discharging differs depending on a temperature. For example, when self-discharging occurs while a temperature of first battery block B1 is higher than a temperature of second battery block B2, first battery block B1 self-discharges greater in amount. Consumption power of peripheral circuits also leads to unevenness in an amount of self-discharging. For example, when power to first voltage detector 11 to third voltage detector 13 is respectively supplied from first battery block B1 to third battery block B3, due to unevenness in consumption power in first voltage detector 11 to third voltage detector 13, a difference should occur in voltages of first battery block B1 to third battery block B3.

A capacity of a battery block in which at least one fuse is blown becomes smaller than a capacity of another battery block in which no fuse is blown. The capacity of the battery block in which the fuse is blown therefore fluctuates greater than the capacity of the other battery block in which no fuse is blown, and thus a voltage difference should occur between the battery blocks. As described above, when a voltage difference among battery blocks reaches a certain value or greater, a control for equalization is performed. In this exemplary embodiment, whether a frequency of controls for equalization actually performed is greater than an assumed frequency is determined, and, when it is determined that a frequency exceeds the assumed frequency, it is assumed that a fuse is blown. In an assumed example state described below, as shown in FIG. 1, two fuses F319, F320 included in third battery block B3 are blown.

Figure 3:
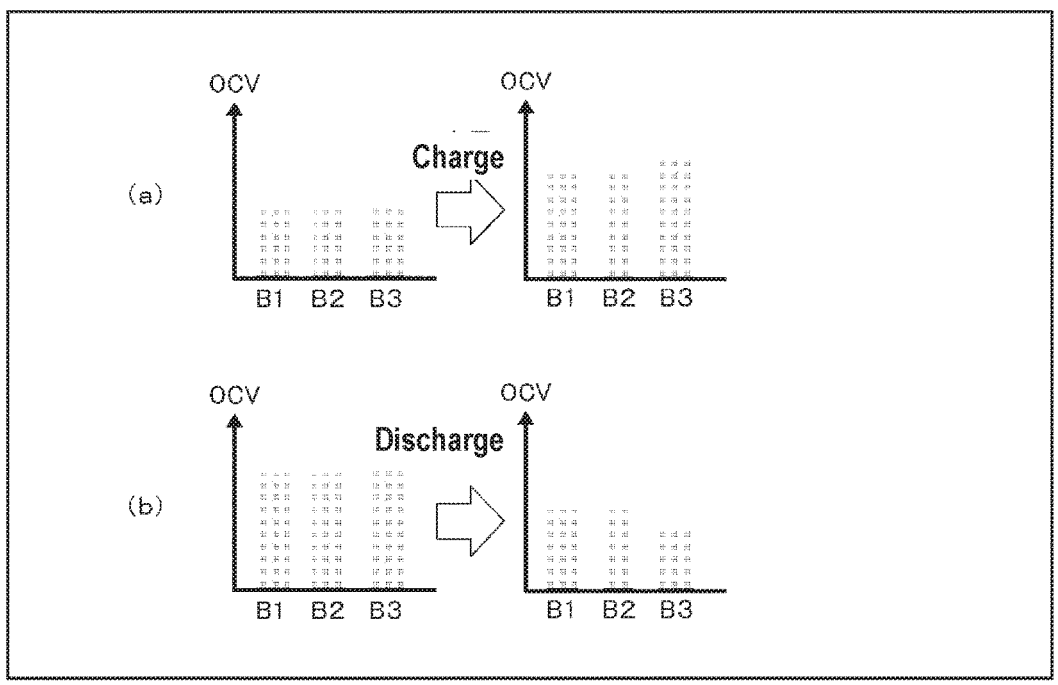
FIG. 3 is a view illustrating voltages of a first battery block to a third battery block according to the exemplary embodiment of the present invention, after the first battery block to the third battery block have been charged or discharged from a state where voltages are even.

FIG. 3 is a view illustrating voltages of first battery block B1 to third battery block B3 according to the exemplary embodiment of the present invention, after first battery block B1 to third battery block B3 have been charged or discharged from a state where voltages are even. Part (a) of FIG. 3 shows voltages after charging, while part (b) of FIG. 3 shows voltages after discharging. As described above, since, in third battery block B3, two fuses F319, F320 are blown, two battery cells S319, S320 are disconnected. A capacity of third battery block B3 accordingly is smaller than capacities of first battery block B1 and second battery block B2. In this state, since, after power storage module 20 is charged, an SOC of third battery block B3 relatively increases, a voltage of third battery block B3 accordingly becomes greater than voltages of first battery block B1 and second battery block B2. On the other hand, since, from this state, when power storage module 20 is discharged, an SOC of third battery block B3 relatively reduces, a voltage of third battery block B3 accordingly becomes smaller than voltages of first battery block B1 and second battery block B2.

Practical Example 1

Next, a practical example 1 when determining whether a fuse is blown based on a frequency of equalization will now be described herein. In the practical example 1, a total value of a number of discharging of all battery blocks is used. Fuse blowout determination unit 18 compares the total value and a threshold value to determine whether a fuse is blown. Alternatively, a total value of an accumulated time of discharging of all the battery blocks is used, and the total value and a threshold value are compared to determine whether a fuse is blown.

FIG. 4 is a flowchart illustrating an example of a process for determining whether a fuse is blown, according to the practical example 1. While power storage module 20 is stopped, when a voltage difference among battery blocks exceeds a set voltage difference, equalization controller 15 performs a control for equalization (S10). Equalization implementation information acquisition unit 16 acquires information on implementation of equalization from equalization controller 15, and records the information in equalization implementation information storage unit 17 (S11).

When a time for determining whether a fuse is blown comes (Y in S12), fuse blowout determination unit 18 reads, from equalization implementation information storage unit 17, the information on implementation of equalization performed in a certain period to calculate a frequency of equalization (S13). The time for determination comes each time a certain period passes. A certain period refers to a period for collecting data in a process for determining whether a fuse is blown, and is set by a designer. A frequency of equalization differs depending on whether a fuse is blown. However, a tendency of separation in such differences increases remarkably as a period extends longer. Accordingly, the longer a certain period, the higher precision in determining whether a fuse is blown. However, a period from when a fuse is blown to when the blown fuse is recognized would likely extend longer. The designer should take into account this trade-off relationship to determine a value of a certain period.

Fuse blowout determination unit 18 compares the calculated frequency of equalization and the threshold value (S14), and determines that, when the frequency of equalization is greater than the threshold value (Y in S14), a fuse is blown (S15). When the frequency of equalization is equal to or smaller than the threshold value (N in S14), fuse blowout determination unit 18 determines that no fuse is blown.

For the threshold value, an assumed value of a frequency of equalization to be performed in the above described certain period during which no fuse is blown is set. A frequency of equalization differs depending on a specification of a battery cell, a State Of Health (SOH), an application of power storage module 20, a temperature in an installation location, and other factors. The designer should set the above described threshold value based on data obtained through experiments and simulations. For example, for power storage module 20 for which three controls for equalization are performed in a week, an assumed number of discharging in a week is six. To this number, a margin of two is added to set a threshold value of eight. In this example, when a number of discharging in a week, which is calculated based on collected data, exceeds eight, it is determined that a fuse is blown. A similar idea is used when a discharge time is used to set a threshold value.

A different threshold value in accordance with an SOH may be used. An SOH refers to a ratio between an initial full charge capacity and a present full charge capacity. Since a storage battery degrades through frequent use, a full charge capacity also lowers. When a full charge capacity lowers, a voltage difference would likely easily occur among battery blocks even though no fuse is blown. Accordingly, as an SOH lowers, the above described threshold value should accordingly be set to a greater value. Fuse blowout determination unit 18 retains a map of threshold values described by SOH ranges. Negative effects due to a lowered SOH can be eliminated, and thus precision in determining whether a fuse is blown can be kept in a certain range.

Practical Example 2

Next, a practical example 2 when determining whether a fuse is blown based on a frequency of equalization will now be described herein. In the practical example 2, when equalization implementation information acquisition unit 16 collects, by battery block, information on implementation of equalization, charge/discharge information indicating that whether a last (latest) charging/discharging operation performed before equalization is performed is a charging or discharging operation is also collected. Equalization implementation information acquisition unit 16 classifies information on implementation of equalization by battery block into whether the equalization has been performed after charging or discharging, and records the classified information. When power storage module 20 is used for an on-vehicle application, equalization implementation information acquisition unit 16 acquires charge/discharge information from, for example, an ECU. When power storage module 20 is used for a stationary peak shaving/back up application, equalization implementation information acquisition unit 16 acquires charge/discharge information from, for example, a power conditioner.

FIG. 5 is a flowchart illustrating an example of a process for determining whether a fuse is blown, according to the practical example 2. While power storage module 20 is stopped, when a voltage difference among battery blocks exceeds a set voltage difference, equalization controller 15 performs a control for equalization (S20). Equalization implementation information acquisition unit 16 acquires charge/discharge information before the control for equalization is performed (S21). Equalization implementation information acquisition unit 16 acquires from equalization controller 15 information on implementation of equalization (S22). Equalization implementation information acquisition unit 16 separates the acquired information on implementation of equalization by battery block, and by after charging/discharging, and records the separated information in equalization implementation information storage unit 17 (S23).

When a time for determining whether a fuse is blown comes (Y in S24), fuse blowout determination unit 18 reads, from equalization implementation information storage unit 17, the information on implementation of equalization performed in a certain period to calculate, by battery block, and by after charging/discharging, an integral time of equalization (S25). In this example, as an integral time of equalization, an accumulated time of discharging is used. An initial value of "1" is set to parameter n (S26).

Fuse blowout determination unit 18 determines whether an integral time of equalization after battery block (n) is charged is greater by first set value α or more than an average of integral times of equalization after another battery block (other than n) is charged, and an integral time of equalization after battery block (n) is discharged is smaller by second set value β or more than an average of integral times of equalization after another battery block (other than n) is discharged (S27). When the above two conditions are satisfied (Y in S27), fuse blowout determination unit 18 determines that a fuse included in battery block (n) is blown (S28). When at least either of the above two conditions is not satisfied (N in S27), fuse blowout determination unit 18 determines that no fuse included in battery block (n) is blown. After that, parameter n is incremented (S29). While parameter n falls within a number of battery blocks included in power storage module 20 (N in S30), step S27 begins, and steps S27 to S29 are repeatedly processed. When parameter n exceeds the number of battery blocks included in power storage module 20 (Y in S30), the process for determining whether a fuse is blown ends.

FIG. 6 is a view illustrating an example of integral times of equalization of the battery blocks after charging and integral times of equalization of the battery blocks after discharging. Part (a) of FIG. 6 shows integral times of equalization after charging, while part (b) of FIG. 6 shows integral times of equalization after discharging. As described above, since, in third battery block B3, two fuses F319, F320 are blown, a capacity of third battery block B3 is smaller than capacities of first battery block B1 and second battery block B2.

As shown in part (a) of FIG. 3 and described above, since, after charging, an SOC of third battery block B3 relatively increases, a voltage of third battery block B3 accordingly becomes greater than voltages of first battery block B1 and second battery block B2. Therefore, since, after charging, a control for equalization is performed to cause third battery block B3 to discharge electricity, an integral time of equalization of third battery block B3 after charging becomes largest. On the other hand, as shown in part (b) of FIG. 3 and described above, since, after discharging, an SOC of third battery block B3 relatively reduces, a voltage of third battery block B3 accordingly becomes smaller than voltages of first battery block B1 and second battery block B2. Therefore, since, after discharging, a control for equalization is performed to cause first battery block B1 and second battery block B2 to discharge electricity, an integral time of equalization of third battery block B3 after discharging becomes smallest.

Determination conditions used in step S27 shown in FIG. 5 can be defined by Equations (1), (2) shown below.

$$\text{Integral time of equalization after battery block } (n) \text{ is charged} > \text{Average integral time of equalization after battery block (other than } n) \text{ is charged} + \alpha \quad \text{Equation (1)}$$

$$\text{Integral time of equalization after battery block } (n) \text{ is discharged} < \text{Average integral time of equalization after battery block (other than } n) \text{ is discharged} - \beta \quad \text{Equation (2)}$$

Symbols α, β represent margins for preventing erroneous determinations, and are calculated beforehand based on differences in a standard integral time of equalization of battery blocks.

The example shown in part (a) of FIG. 6 satisfies a relationship of Integral time of equalization after third battery block B3 is charged>Average integral time of equalization after first battery block B1 and second battery block B2 are charged+α. The example shown in part (b) of FIG. 6 satisfies a relationship of Integral time of equalization after third battery block B3 is discharged<Average integral time of equalization after first battery block B1 and second battery block B2 are discharged−β. Therefore, it is determined that a fuse included in third battery block B3 is blown. The examples shown in FIGS. 5, 6 have exemplified that, as a frequency of equalization, an integral time of equalization (accumulated time of discharging for equalization) is used. However, an integral number of equalization (accumulated number of discharge for equalization) may be used.

As described above, according to this exemplary embodiment, by comparing a frequency of equalization performed in a certain period and an assumed frequency of equalization, whether a fuse connected to a cell is blown can precisely be detected at a lower cost. Since no voltage detection line is required for fuses, increases in both cost and circuit area can be suppressed. Since no current integration value is used for determination, higher determination precision can be achieved. When a current integration value is used, errors in offset/gain in a current sensor (for example, hole element) and a current detection circuit (for example, operational amplifier) are integrated, and thus a total error would increase. On the other hand, in this exemplary embodiment, since a voltage value (OCV) is used, no error is integrated, and thus erroneous determinations can be suppressed.

According to the practical example 2, a battery block in which a fuse is blown can be identified. On the other hand, a method based on a current integration value faces difficulty in identifying a battery block in which a fuse is blown. According to the practical example 2, since a difference in voltage behavior in the battery blocks between a case when a fuse is blown and a case when no fuse is blown can be identified quicker than the practical example 1, the certain time described above can be set shorter than the certain time used in the practical example 1. Therefore, while precision in determination is kept maintained, a blown fuse can promptly be found.

The above explanation is made based on the exemplary embodiment of the present invention. The person of the ordinary skill in the art can understand that the exemplary embodiment is illustrated, and these constitution elements and these combined processes can be modified, and such modified examples are covered by the scope of the present invention.

In the above exemplary embodiment, as a control for equalization, a control for causing, when a battery block has a least voltage, another battery block to discharge electricity to level or to almost level at least a voltage of the other battery block to the least voltage has been described. For this point, a control may be performed, such that, when a battery block has a highest voltage, an auxiliary power supply is used to charge another battery block to level or to almost level at least a voltage of the other battery block to the highest voltage. In this case, the relationships of charging and discharging shown in FIGS. 3, 6 become opposite, as well as the inequality signs of Equations (1), (2) described above become opposite.

In the above exemplary embodiment, the examples where a period for determining whether a fuse is blown is set to a certain time have been described. For this point, whether a fuse is blown may be determined each time equalization is performed. In this case, when data is acquired from equalization implementation information storage unit 17, data for a specified past period (the period should advantageously include a past period before previous equalization is performed) should be acquired to calculate a frequency.

In the above described exemplary embodiment, the examples using, as a power storage device, a storage battery have been assumed. However, a capacitor (for example, electric double layer capacitor) may be used. Since a control for equalization can be performed for a capacitor, similar or identical to a storage battery, a consideration similar or identical to a storage battery can be applied to a capacitor.

The exemplary embodiment may be identified with items described below.

[Item 1]

Management device (10) for managing power storage device (20) in which a plurality of power storage blocks (B1 to B3) in which a plurality of series circuits of fuses (F11 to F120, F21 to F220, F31 to F320) and power storage cells (S11 to S120, S21 to S220, S31 to S320) is connected in parallel is connected in series, management device (10) including equalization controller (15) for performing, when a voltage difference among power storage blocks (B1 to B3) exceeds a set voltage difference, a control for equalizing power storage blocks (B1 to B3), and blowout determination unit (18) for determining, based on a frequency of equalization performed by equalization controller (15), whether one of fuses (F11 to F120, F21 to F220, F31 to F320) is blown.

Therefore, whether one of fuses (F11 to F120, F21 to F220, F31 to F320) connected to power storage cells (S11 to S120, S21 to S220, S31 to S320) is blown can precisely be detected at a lower cost.

[Item 2]

Management device (10) according to item 1, further including voltage detectors (11 to 13) for detecting voltages of power storage blocks (B1 to B3), where blowout determination unit (18) determines that, when the frequency of equalization is higher than a set frequency, one of fuses (F11 to F120, F21 to F220, F31 to F320) is blown.

Therefore, based on a difference in a frequency of equalization between a case when one of fuses (F11 to F120, F21 to F220, F31 to F320) is blown and a case when no fuse is blown, whether one of fuses (F11 to F120, F21 to F220, F31 to F320) is blown can be determined.

[Item 3]

Management device (10) according to item 2, where, for the set frequency, a different value in accordance with a State Of Health (SOH) is used.

Therefore, in a process for determining whether one of fuses (F11 to F120, F21 to F220, F31 to F320) is blown, negative effects due to a change in an SOH can be eliminated.

[Item 4]

Management device (10) according to item 1, where equalization controller (15) performs, in a period during which power storage device (20) is neither charged nor discharged, a control for equalizing power storage blocks (B1 to B3), management device (10) further includes equalization implementation information acquisition unit (16) for acquiring information on implementation of a control for equalizing the power storage blocks, and information indicating that a state before the control for equalization is performed is either of a charging state and a discharging state, and blowout determination unit (18) determines, based on a frequency of equalization of power storage blocks (B1 to B3) performed after charging and a frequency of equalization of power storage blocks (B1 to B3) performed after discharging, whether one of fuses (F11 to F120, F21 to F220, F31 to F320) included in power storage blocks (B1 to B3) is blown.

Therefore, a process for further precisely determining whether a fuse is blown can be achieved.

[Item 5]

Management device (10) according to item 4, where equalization controller (15) causes, when, among the plurality of power storage blocks (B1 to B3) included in power storage device (20), one of power storage blocks (B3) has a least voltage, at least another one of power storage blocks (B1, B2) to discharge electricity so that a voltage of the other one of power storage blocks (B1, B2) lowers closer to the least voltage, and blowout determination unit (18) determines that, when an integral time of equalization performed, for a certain period, after one of power storage blocks (Bn) is charged is greater by first set value ($\alpha$) or more than an average integral time of equalization performed, for a certain period, after another one of power storage blocks (other than Bn) is charged, and when an integral time of equalization performed, for a certain period, after the one of power storage blocks (Bn) is discharged is smaller by second set value ($\beta$) or more than an average integral time of equalization performed, for a certain period, after the other one of power storage blocks (other than Bn) is discharged, one of fuses (Sn1 to Sn20) included in the one of power storage blocks (Bn) is blown.

Therefore, one of battery blocks (Bn) in which one of fuses (F11 to F120, F21 to F220, F31 to F320) is blown can be identified.

[Item 6]

Power storage system (1) including power storage device (20), and management device (10) for managing power storage device (20), according to any one of items 1 to 5.

Therefore, whether one of fuses (F11 to F120, F21 to F220, F31 to F320) connected to power storage cells (S11 to S120, S21 to S220, S31 to S320) is blown can precisely be detected at a lower cost.

The invention claimed is:

1. A management device for managing a power storage device, in which a plurality of power storage blocks, where a plurality of series circuits each configured of a fuse and a power storage cell are connected in parallel, are connected in series, the management device comprising:
    an equalization controller for performing, when at least one voltage difference among the power storage blocks exceeds a set voltage difference, a control for equalizing the power storage blocks; and
    a blowout determination unit for determining, based on a frequency of equalization performed by the equalization controller, whether at least one of the fuses is blown.

2. The management device according to claim 1, further comprising voltage detectors for detecting voltages of the power storage blocks,
    wherein the blowout determination unit determines that, when the frequency of equalization is higher than a set frequency, at least one of the fuses is blown.

3. The management device according to claim 2, wherein, for the set frequency, a different value in accordance with a State Of Health (SOH) is used.

4. The management device according to claim 1, wherein
    the equalization controller performs, in a period during which the power storage device is neither charged nor discharged, a control for equalizing the power storage blocks,
    the management device further includes an equalization implementation information acquisition unit for acquiring information on implementation of a control for equalizing the power storage blocks, and information indicating that a state before the control for equalization is performed is either of a charging state and a discharging state, and
    the blowout determination unit determines, based on a frequency of equalization of the power storage blocks performed after charging and a frequency of equalization of the power storage blocks performed after discharging, whether at least one of the fuses included in the power storage blocks is blown.

5. The management device according to claim 4, wherein
    the equalization controller causes, when, among the plurality of power storage blocks included in the power storage device, one of the power storage blocks has a least voltage, at least another one of the power storage blocks to discharge electricity so that a voltage of the at least another one of the power storage blocks lowers closer to the least voltage, and
    the blowout determination unit determines that,
        when an integral time of equalization performed, for a certain period, after one of the power storage blocks is charged is greater by a first set value or more than an average integral time of equalization performed, for the certain period, after another one of the power storage blocks is charged,
        and when an integral time of equalization performed, for the certain period, after the one of the power storage blocks is discharged is smaller by a second set value or more than an average integral time of equalization performed, for the certain period, after the another one of the power storage blocks is discharged,
    at least one of the fuses included in the one of the power storage blocks is blown.

6. A power storage system comprising:

a power storage device; and the management device for managing the power storage device, according claim 1.

* * * * *